US012606902B2

(12) United States Patent
Parris

(10) Patent No.: US 12,606,902 B2
(45) Date of Patent: Apr. 21, 2026

(54) METHOD AND MATERIALS FOR CREATING PATTERNS OF CARBON AND/OR OTHER ELEMENTS ON SUBSTRATES OR WITHIN LIQUID OR FROZEN MEDIA BY DIRECTED ENERGY DEPOSITION OF CARBON AND OTHER ELEMENTS

(71) Applicant: George Edward Parris, Gaithersburg, MD (US)

(72) Inventor: George Edward Parris, Gaithersburg, MD (US)

( * ) Notice: Subject to any disclaimer, the term of this patent is extended or adjusted under 35 U.S.C. 154(b) by 23 days.

(21) Appl. No.: 18/423,231

(22) Filed: Jan. 25, 2024

(65) Prior Publication Data

US 2024/0218495 A1 Jul. 4, 2024

Related U.S. Application Data

(62) Division of application No. 15/927,407, filed on Mar. 21, 2018, now Pat. No. 11,932,929.

(60) Provisional application No. 62/547,963, filed on Aug. 21, 2017.

(51) Int. Cl.
*C23C 14/06* (2006.01)
*C01B 32/225* (2017.01)
*C23C 14/28* (2006.01)

(52) U.S. Cl.
CPC ........ *C23C 14/0605* (2013.01); *C01B 32/225* (2017.08); *C23C 14/28* (2013.01)

(58) Field of Classification Search
CPC ... C23C 16/047; C23C 16/483; C23C 16/403; C23C 18/143; C23C 16/16; C23C 16/481
See application file for complete search history.

(56) References Cited

U.S. PATENT DOCUMENTS

| | | | | |
|---|---|---|---|---|
| 4,042,006 A | * | 8/1977 | Engl ..................... | H01C 17/20 |
| | | | | 427/250 |
| 4,340,617 A | * | 7/1982 | Deutsch .............. | H01L 21/0217 |
| | | | | 438/758 |
| 4,359,485 A | * | 11/1982 | Donnelly .............. | H01L 21/288 |
| | | | | 257/E21.174 |
| 4,451,503 A | * | 5/1984 | Blum .................... | C23C 16/483 |
| | | | | 204/157.4 |

(Continued)

*Primary Examiner* — Michael P Wieczorek
(74) *Attorney, Agent, or Firm* — Ingenium Patents LLC; Peter R Kramer

(57) ABSTRACT

This invention claims a method for creating patterns of carbon or other elements as deposits on the surface of substrates or as self-supporting filaments in liquid or solid media by the selected application of directed energy. In some embodiments, the deposits or filaments may be of primary interest because of their mechanical properties. In other embodiments, the patterns may have useful physical properties such as being electrically conductive, semi-conductive or electric insulators. Many different deposit precursors, types of directed energy, and adjunct reagents are described. The invention anticipates numerous different embodiments created by selecting various combinations of these elements and sequences of application as a means to build complex devices. In particular, the patterns may constitute the elements of an electric circuit or device (e.g. wires, capacitors, diodes, transistors).

7 Claims, 7 Drawing Sheets

(56)                    References Cited

U.S. PATENT DOCUMENTS

| 4,608,117 | A | * | 8/1986 | Ehrlich | ................. | C23C 16/483 |
| | | | | | | 430/935 |
| 5,407,710 | A | * | 4/1995 | Baum | .................... | H05K 3/146 |
| | | | | | | 427/124 |
| 7,396,705 | B2 | * | 7/2008 | Tseng | ..................... | C23C 10/02 |
| | | | | | | 438/161 |
| 8,541,066 | B2 | * | 9/2013 | Her | ...................... | C23C 16/047 |
| | | | | | | 216/13 |

* cited by examiner

[22]

[19]

[18]

[21]

[20]    [7]

METHOD AND MATERIALS FOR CREATING PATTERNS OF CARBON AND/OR OTHER ELEMENTS ON SUBSTRATES OR WITHIN LIQUID OR FROZEN MEDIA BY DIRECTED ENERGY DEPOSITION OF CARBON AND OTHER ELEMENTS

This application is a divisional application that claims benefit of currently pending U.S. application Ser. No. 15/927,407 that was filed on Mar. 21, 2018. U.S. application Ser. No. 15/927,407 claims the benefit of the filing date of U.S. Provisional Patent application Ser. No. 62/547,963 filed on Aug. 21, 2017. The contents of U.S. application Ser. Nos. 15/927,407 and 62/547,963 are hereby entirely incorporated by reference.

FIELD OF THE INVENTION

The present invention relates generally to a method for forming patterns of carbon and/or other elements, which may be useful as components in electrical circuits and/or may possess desirable physical properties. More specifically, the present invention applies directed energy onto specific compounds to cause polymerization and/or decomposition in a pattern determined by the application of energy (not by the presence or absence of the starting materials or masks).

BACKGROUND OF THE INVENTION

Previous methods related to forming metallic (conducting) or amorphous (non-conducting) carbon and/or carbon doped with metals or insulating materials (such as MgO) on surfaces require a physical pattern such as a mask. These masks might include graphitizing catalyst or optically opaque patterns to be present on the surface receiving the deposit before the carbon or other elements are applied as a general surface coating. For example, photolithography is well known in the electronics industries. In other previous methods, a general coating of carbon is applied to a surface by uncontrolled decomposition of carbon compounds; and the carbon or doped carbon may be etched or repositioned by chemical processes to form a conducting pattern, such as a circuit, or non-conducting zone. All of these processes require numerous complex physical and chemical steps to produce useful products. These processes typically involve a general precipitation of the carbon or other elements over the surface and they typically claim to use a wide variety of stable carbon sources (e.g., methane), which are decomposed to carbon only under extreme conditions. There are many examples of the use of carbon vapor deposition in which general (undirected) heating is used to deposit carbon from the gas phase onto the surface of a substrate. There are also many examples of where a polymer is applied generally to a surface (e.g., by spin coating) and then decomposed to carbon on the surface by general heating. These carbon sources include volatile hydrocarbons (alkanes, olefins, acetylenes), carbon oxides, and other carbon base compounds. Carbon fiber materials are typically formed from sheets of conventional fibers (e.g., polyacrylonitrile) by processes involving general hearting to cause oxidation and decomposition of the polymer at very high temperature. All of the aforementioned carbon sources are difficult to convert into anything resembling a precisely patterned, electrically conducting carbon pathway and generally only do so by an uncontrollable process that depends on the thermodynamic stability of graphitic carbon to deposit a random array of graphitic carbon on a surface. In contrast, it is the objective of the present invention to produce precisely positioned two-dimensional and three-dimensional patterns of carbon and other elements by efficient, controllable polymerization and decomposition of compounds of carbon or other elements by the application of activating energy in forms that can be controlled in space and time.

The present invention seeks to increase the precision and efficiency of producing a useful form of carbon and/or other elements in a selected pattern by the polymerization and/or decomposition of appropriate deposit precursors of carbon and/or other elements. In some aspects, this approach is similar to continuous 3-D printing (U.S. Pat. Nos. 7,892,474 B2; 9,205,601 and 9,211,678), which uses energy (UV light) projected into a polymer resin to initiate polymerization in the resin to form a polymer. Note that in these processes, the resin is not a monomer but rather a liquid oligomer (or solid oligomer as small beads) and the final product is a stable conventional carbon-based polymer. In contrast, by a careful selection of the monomeric reactant, the invention described here allows the facile conversion of the monomer into pure carbon (with or without other selected elements deposited from other monomers, especially metals and metalloids) and the invention described here avoids the necessity of a mask by using directed energy that may be controlled by a computer to produce a selected pattern.

The directed energy will most often be of one or more of the following types: (i) electromagnetic radiation (e.g., x-rays, UV, visible, or IR) either as a focused or collimated beam or as a laser beam; (ii) electromagnetic radiation delivered in a specific pattern produced by interference patterns of multiple overlapping electromagnetic waves (e.g., produced as in the "double slit" experiment); (iii) high kinetic energy particles (e.g., electrons (beta rays), alpha particles, protons or other atomic nuclei); (iv) electromagnetic induction (used to selectively heat conducting materials), (v) electric currents through the medium containing the monomer(s). Multiple sources of various types of directed energy may be applied concurrently or sequentially to obtain a variety of effects. In particular, the directed energy may directly activate the monomers (especially in condensed phase reaction mixtures) to form a filament or the directed energy may be focused onto the surface of a substrate to cause localized heating, which causes the polymerization and deposition of carbon or other elements when molecules of the monomers in the gas phase come into contact with the hot spot.

The success of this technology depends upon careful selection of monomeric starting material. Carbon-based monomers (typically olefins) (i) must be easily induced to polymerize by the directed energy and produce a polymer conforming to the desired pattern and (ii) the resulting (polyolefin) polymer must readily, efficiently and cleanly decompose to pure carbon (preferably sp2-hybridized). Compounds that are used to deliver other elements (e.g., metals and metalloids) or insulating salts (e.g., MgO or $Al_2O_3$) must also decompose readily, efficiently, and cleanly under conditions compatible with the process.

The monomeric compounds of interest here have empirical formula "HCX" where X is typically a halide (—Cl, —Br, —I), hydroxide (—OH) or alkoxide (—OR). For example, it is known that polymers made from 1,1-dichloroethylene ($Cl_2C=CH_2$) or carbohydrates readily decompose into carbon with loss of the fragments of HX. Some use has been made of carbohydrates and derivatives of carbohydrate polymers to produce useful carbon products. For example, the earliest filaments for electric light bulbs were manufactured by thermally decomposing rayon fibers. However, carbohydrates are not as useful in forming patterns as olefin monomers. Thus, the current invention focuses on the well-known compound 1,1-dichloroethylene (a.k.a., 1,1-dichloroethene, DCE) which has been used to manufacture a polymer known by the trade name Saran™ by Dow Chemical Company.[1] For this invention, 1,1-DCE, its isomers (1,2-DCE), its analogues (e.g., dibromoethylene and aromatics such as 1,2,4-trichlorobenzene) and compounds that readily decompose into these compounds such as 1,1,1-trichloroethane are believed to be the most satisfactory for the two-step process outlined below:

1 See: *Dow Chemical Vinylidene Chloride Monomers and Polymers*. Reprint from *Kirk-Othmer: Encyclopedia of Chemical Technology*. 4th Ed. Vol. 24. John Wiley & Sons Inc. 1977 pp. 882-923. Available on the Internet: http://msdssearch.dow.com/PublishedLiteratureDOWCOM/dh_005d/0901b8038005d707.pdf Monomer→Directed Energy→Polymer (in a selected pattern)

Polymer→Directed or General application of energy→Carbon Deposit

Although the process involves two chemical transformations, the two transformations may occur concurrently at the same location. Thus, from an operation standpoint, the process may only involve a single efficient process operation.

An important feature of the process is prevention of random spread of the polymerization in directions away from the point of application of directed energy. This is achieved when using the monomer in the gas phase by the fact that the monomers (as gas molecules) rarely come into contact. However, in liquid or solid (frozen liquid) phases, effective levels of polymerization suppressing agents must be incorporated in the condensed phase. For example, it is known that pure liquid 1,1-DCE polymerizes in a few days at room temperature unless a polymerization suppressing agent is used. It is also well-known that the types of energy used here as directed energy, can initiate mass (uncontrolled, three-dimensional) polymerization in condensed phases of 1,1-DCE. Thus, an essential element of the process is use of well-known agents (e.g., U.S. Pat. No. 3,984,489 A) to suppress uncontrolled polymerization (i.e., outside the desired pattern).

The success of the process hinges on the specific chemical reactivity of these compounds. These monomers are generally volatile and the olefins are well-known to undergo polymerization to form polymers that contain equal numbers of halogens and hydrogens in alternating proximity (such as the well-known material poly(1,1-dichloroethylene), a.k.a., polyvinylidene chloride, Saran™).

$$Cl_2C{=}CH_2 \; (sp^2) \longrightarrow poly \text{---}Cl_2C\text{---}CH_2\text{---} \; (sp^3)$$

In the absence of base, thermal degradation of the polymer begins at as low as 120° C.; and above 200° C., this polymer unzips HX by a free radical mechanism:

$$poly \; \text{---}Cl_2C\text{---}CH_2\text{---} \; (sp^3) \longrightarrow$$
$$poly \; (sp^2) \; \text{---}HC{=}CX\text{---} \; + \; HX$$

The resulting "poly $(sp^2)$ —HC═CX—" polymer (a.k.a., polychloroacetylene) is moderately stable especially at low temperature (even in the presence of UV light). But, at higher temperatures (above 200° C.), these strands crosslink by the thermally-allowed Diels-Alder reaction to form 6-membered rings with sp2 and sp3 bonds (Dow, 1977, p. 902).

$$poly \; (sp^2) \; \text{---}HC{=}CX\text{---} \longrightarrow$$
$$\text{Diels-Alder Crosslinking } (sp/sp^2) \text{ polymer}$$

The cross-linked network is then subject to another round of free-radical elimination of the second mole of HX to produce a carbon polymer primarily involving $sp^2$ hybridized carbon.

In the case where X is a halogen, other options are available. At low temperature, both the free-radical unzipping and (subsequent) Diels-Alder reactions mentioned above will be suppressed. At low temperature, in the presence of a moderate (e.g., sodium hydroxide, sodium ethoxide) to strong base (e.g., methyl lithium, sodium amide), dehydrohalogenation (E2 mechanism) is anticipated to dominate over the Diels-Alder mechanism forming an $sp^2$ polymer (similar to that obtained in the radical decomposition). But, with the Diels-Alder crosslinking suppressed by low temperature, the dehydrohalogenation (E2 mechanism) will continue with elimination of HX to form linear (sp-hybridized) polymers that also yield aromatic crosslinked networks via the Diels-Alder mechanism.

$$poly \; (sp) \;\; {=}C{=}C{=}C{=}C{=} \;\; or \;\; \text{---}CC\text{---}CC\text{---} \longrightarrow$$
$$sp^2\text{---carbon polymer}$$

The ultimate linear (sp) carbon polymer may be either olefinic or acetylenic and the HX is volatile or soluble in the media or gas from which the carbon-only polymer was formed. The ultimate form of carbon polymer can be controlled by managing the temperature and presence of base or acid in the reaction mixture when the reaction is carried out in liquid or solid phase. Thus, the initially formed polymer may subsequently or concurrently be decomposed by the same energy source or a different energy source to yield an essentially pure carbon polymer.

Regardless, once the poly-sp-hybridized polymer is formed, it is very easily converted into the more stable poly-$sp^2$ electrically conducting sheets (e.g., graphene), fibers and tubes (e.g., carbon nanotubes). Indeed, the reaction is known to be spontaneous such that it is likely impossible to isolate any of the intermediate polymers:

$$ {=}C{=}C{=}C{=}C{=} \;\; or \;\; \text{---}CC\text{---}CC\text{---} \longrightarrow$$
$$\text{carbon fiber, graphene and/or carbon nanotubes.}$$

The process is compatible with concurrent or subsequent doping with a variety of other elements using other volatile compounds using the same directed energy technology acting on such compounds as but not limited to $Ni(CO)_4$ or $Fe(CO)_5$, $SiH_4$, $AsH_3$, $PH_3$, $SH_2$ and/or $As(CH_3)_3$. Different energy sources (e.g., wavelengths of light) may be used to selectively decompose different compounds and deposit different elements at different times and places in the process. The possibility of forming silicon-based semiconductors in thus incorporated in this invention (e.g., by the concurrent deposition of Si and As from their respective hydrides of methyl derivatives).

Insulating layers of nonconducting metal oxides (e.g., MgO) can be similarly applied by directed energy techniques using, for example, tetrameric (methylmagnesium t-butoxide). This compound is also volatile and easily decomposed to MgO, facts that were first discovered by the author of this patent application.[2]

[2]See: M. M. Sung, C. G. Kim, J. Kim, Y. Kim. Chemical Beam Deposition of MgO Films on Si Substrates Using Methylmagnesium tert-Butoxide. *Chem. Mater.,* 2002, 14(2): 826-831. Parris GE. 2010. Comment on "Methylmagnesium Alkoxide Clusters with $Mg_4O_4$ Cubane- and $Mg_7O_8$ Biscubane-Like Cores: Organometallic Precursors for Low-Temperature Formation of MgO Nanoparticles with Variable Surface Defects" *Chemistry of Materials.* 22 (15):4512.

These features clearly distinguish the claimed process from the prior art.

DETAIL DESCRIPTIONS OF THE INVENTION

Figure 1:
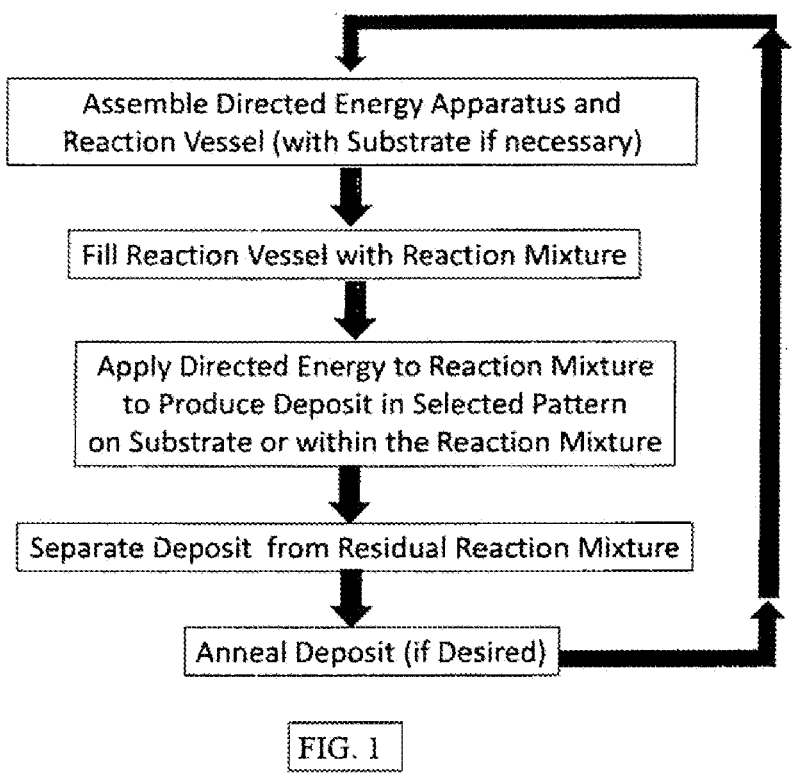
FIG. 1A Flow Chart of the Method

The present invention is a method to form useful carbon-based materials (especially electrically conducting networks primarily of graphitic carbon) and/or other elements using directed energy to polymerize dihaloethenes and/or related compounds in a preselected pattern followed by decomposition of the polymer to carbon by elimination of hydrohalic acid with or without concurrent or subsequent deposition of selected elements or metal oxides. (FIG. 1) The present invention increases the precision and efficiency of producing these materials, which may have unique electrical or physical properties, such that the electrically conducting networks have applications in circuitry, capacitors, semiconductors and other electronic applications by producing a conducting pattern or a non-conducting zone.

In order to execute the steps of the present invention, at least two things are needed: (i) carbon-based monomers (typically olefins or aromatics) containing essentially equal numbers of halogen and hydrogen atoms (e.g., 1,1-dichloroethylene, trichlorobenzene); and (ii) a source of energy capable of initiation of polymerization that can be directed as a controlled beam or pattern onto the monomer or onto the surface of a substrate with which the monomer comes into contact in such a way as to cause localized activation of the monomer or localized activation of the surface. Concurrent with or subsequent to the formation of a polymer (of the general idealized formula $C_nH_mX_m$) in the desired physical pattern, the polymer is decomposed to pure carbon ($C_n$) by elimination of HX (e.g., HCl which is volatile and easily removed) by directed or general application of energy or by the action of chemical reagents (e.g., base). Note that it is generally recognized that at high enough temperature (e.g., >1000° C.) any carbon deposit can be converted to graphite (the most stable form of carbon). For example, polyacrylonitrile (PAN) is widely used to manufacture carbon fibers. It must first be partially oxidized and then decomposed in the range 1000-3000° C. to eliminate the unwanted nitrogen and oxygen atoms. In contrast, in the current invention by specifically selecting polymers with empirical formulae $HC_nX$, the temperature of forming $sp^2$-hybridized carbon may be lowered to as little as 200-500° C. If chemical agents (e.g., alkali) are used to expedite the elimination, the $sp^2$-hybrid carbon deposit may be formed at or below room temperature.[3] Importantly, little or none of the carbon becomes volatile during degradation (i.e., unlikely polyvinylchloride which decomposes to benzene).

[3]R. D. Bohme and R. A. Wessling. *The thermal decomposition of poly (vinylidene chloride) in the solid state.* July 1972. https://onlinelibrary.wiley-.com/doi/pdf/10.1002/app.1972.070160713 D. E. Winkler. Mechanism of polyvinyl chloride degradation and stabilization. *Journal of Polymer Science. Part A.* February 1959. https://onlinelibrary.wiley.com/doi/pdf/10.1002/pol.1959.1203512802

Thus, the carbon-based monomeric compounds of most interest here have empirical formula $HC_nX$ where X is typically a halide (—Cl, —Br, —I). For example, it is known that polymers made from 1,1-dichloroethylene ($Cl_2C$=$CH_2$) readily decompose into carbon with loss of the fragments of HX. The current invention focuses on the well-known compound 1,1-dichloroethylene (a.k.a., 1,1-dichloroethene, DCE). For this invention, 1,1-DCE, its isomers (e.g., 1,2-DCE), its analogues (e.g., dibromoethylene and aromatics such as 1,2,4-trichlorobenzene) and compounds that readily decompose into these compounds such as 1,1,1-trichloroethane or hexachlorocyclohexane are preferred.

In some embodiments polymerization inhibitors may be employed in the reaction mixture specially to prevent spread of the polymer beyond the limits of the desired pattern. Many compounds with varying efficacy have been studied and reported (U.S. Pat. No. 3,984,489 A). Generally, they terminate polymer growth or scavenge free radicals or ions that catalyze polymerization.

The directed energy will most often be of one of the following types: (i) electromagnetic radiation (e.g., x-rays, ultraviolet, visible, or infrared) either as a focused beam, collimated beam or a laser beam; (ii) electromagnetic radiation delivered in a specific pattern produced by interference patterns of waves; (iii) high kinetic energy particles (e.g., electrons (beta rays), alpha particles, protons or other atomic nuclei); (iv) electromagnetic induction (used to selectively heat conducting materials), and/or (v) electric currents through the medium containing the monomer(s).

In some embodiments, other elements (such as metals, metalloids or nonmetals) may be deposited independently or concurrently with the carbon polymer in patterns that are independent or collocated with the carbon polymer. There are a number of well-known volatile or soluble compounds that can be decomposed by directed energy to form a selected pattern. Examples of such compounds include $Fe(CO)_5$, $Ni(CO)_4$, $B_2H_6$, $Al_2(CH_3)_6$, $SiH_4$, $Pb(CH_3)_4$, $NH_3$, $PH_3$, $AsH_3$, $SF_6$, $UF_6$ and many others.

Thallada Bhaskar et al. Analysis of chlorine distribution in the pyrolysis products of poly(vinylidene chloride) mixed with polyethylene, polypropylene or polystyrene. *Polymer Degradation and Stability.* 89 (1) July 2005, pp. 38-42. https://www.sciencedirect.com/science/article/pii/S0141391005000327 #!

In some embodiments, insulating layers of metal oxides (e.g., MgO) may be required to separate electrically conducting patterns/circuits. These layers can be deposited before, during or after deposition of the conducting pattern by the use of directed energy or general heating of compounds such as the tetramer of methylmagnesium t-butoxide, which decomposes to MgO, methane and butene.

Many different embodiments of the invention are anticipated. In some embodiments, the reaction mixture will initially include only a deposit precursor for a single element (e.g., 1,1-dichloroethylene). In other embodiments, the initial reaction mixture may include two or more deposit precursors for the same element or different elements (e.g., $SiH_4$ and $AsH_3$). In some embodiments, the reaction mixture will be complex also including solvents, catalysts, and polymerization suppressants. In all cases, the composition of the reaction mixture will change as byproducts of decomposition will form and the concentration of reactants decrease. However, the reaction mixture may be kept more or less constant by recycling reactants and scavenging the byproducts by suitable means. Variations of these types in the composition of the reaction mixture are generally known and rarely considered novel by people skilled in the art of chemistry.

(a) If the monomer is in a condensed phase reaction mixture (e.g., adsorbed/absorbed onto a substrate or a bulk liquid or a solid (frozen liquid)), a polymerization inhibitor will usually be needed in the condensed phase to prevent spread of the polymerization outside of the intended pattern.

(b) If the monomer is in the gas phase, the substrate may be suspended in the gas or may be a wall of the chamber containing the gas.

(c) In some embodiments, a compound that decomposes to another element (e.g., a nonmetal, metal or metalloid) may by mixed with the monomer and concurrently decomposed to deposit the desired element at the same place and time as the carbon-polymer; or the other elements can be added in subsequent steps and may or may not be collocated with the initial deposit.

(d) If the first step involves a gas phase, the gas may be recirculated to facilitate removal of HX or progressively modified to change its pressure or composition.

(e) More than one type of directed energy may be applied sequentially or concurrently and coaxially or at different angles to activate the monomer in the first chemical step or to facilitate decomposition of the polymer in the second chemical step.

(f) If the monomer (in the gas phase or adsorbed/absorbed to a substrate) is activated by directed energy applied to the substrate, the directed energy may be applied to the front side of the substrate (i.e., the side in contact with the monomer) by focusing a beam or pattern of energy on the surface such that its energy density is lower as it passed through the monomer. The directed energy may also be applied to the backside of the substrate. In the case of heating by electrical induction, the entire substrate is heated such that its surface become hot.

(g) If the directed energy is in the form of an electric current, the electrodes may be any size or shape (e.g., the cross-section can be round, multilateral, a thin edge, an open circle, spherical, or other) and may be moved laterally or variable separation to trace out the desired pattern. The current carriers in the reaction mixture may be the monomers or other species and the current may or may not produce an arc.

(h) If the pattern of directed energy is formed by an interference pattern of electromagnetic radiation, any technique may be used to establish the interference pattern (e.g., multiple slits, curved slits, pinholes, edges). Waves may be projected from different angles into the reaction mixture. Waves may be of any wavelength.

(i) Conducting materials made of metals or electrically-conducting carbon of any size or shape (e.g., nanoparticles of metal suspended in a current of monomer vapor or macroscopic parts suspended by a thread) can be activated by electromagnetic inductive heating.

(j) If the directed energy is a high kinetic energy particle and the monomer is in a condensed phase (liquid or solid), the Bragg effect can be used to selectively initiate polymerization and/or decomposition within the condensed phase.

(k) The directed energy may be applied in a steady stream, or the type, pattern and intensity of directed energy can be interrupted or varied over time. The variations in directed energy may be controlled manually or by computer program.

The typical sequence of operation is as follows:

Initially, the reaction vessel is filled with the reaction mixture (e.g., deposit precursor and other reagents). Subsequently, a directed energy emission is selectively emitted towards the reaction mixture with the directed energy emission apparatus. The deposit precursor(s) is polymerized and decomposed adjacent to a point of incidence of the directed energy emission within the reaction vessel to produce a deposit layer or filament (i.e., a self-supporting deposit). The deposit is initially a polymer but may convert spontaneously into an immobile allotrope of the elements of the deposit precursors. The initial polymer may be converted to the immobile allotrope of the element by continued application of the directed energy or annealed by general heating of the deposit after separating the residual reaction mixture.

In accordance to a first embodiment (i.e., deposition from the gas phase) of the present invention (FIG. 2), a solid substrate [1] is required in order to collect the deposit layer [2]. The solid substrate may be the interior wall of the reaction vessel or, preferably, a substrate mounted within the reaction vessel to allow the user to easily remove the solid substrate to extract the deposit layer and clean the solid substrate. For this embodiment, the deposit precursor is preferred to be in the vapor phase [3]. The directed energy emission [4] is oriented towards the solid substrate to heat the solid substrate. The solid substrate is heated at the point of incidence of the directed energy emission [5]. As the deposit precursor molecules impact the solid substrate at the point of incidence, the deposit precursor is decomposed adjacent to the point of incidence onto the solid substrate to produce the deposit layer. The directed energy emission is either directed through a storage volume of the reaction vessel onto the solid substrate or directed onto the solid substrate external to the reaction volume to ensure the deposit layer forms on the solid substrate.

More specifically to the first embodiment of the present invention, electromagnetic radiation may be focused, collimated or coherent (laser). These energy sources will typically be at relatively long wavelengths (greater than 300 nm and often greater than 700 nm) to avoid photolysis in the gas phase and maximize surface heating of the substrate. Focusing of diffuse electromagnetic radiation emission may be preferred when the radiation must pass through the reaction mixture to reach the substrate. The less-focused part of the beam will be less likely to produce random decomposition in the vapor phase [6].

In accordance to the preferred incarnation of the first embodiment, the deposit precursor is a volatile substance comprising a group of thermally unstable compounds of carbon, metals, metalloids or nonmetals. More specifically, the volatile carbon deposit precursor is preferred to be 1,1-dichloroethylene, isomers of 1,1-dichloroethylene, analogues of 1,1-dichloroethylene or compounds that readily decompose into these compounds. These compounds are preferred because of the ready polymerization or these olefins and the subsequent ready elimination of HX by moderate heating or treatment with base (e.g., hydroxide) to yield virtually pure carbon. Metal carbonyls (e.g., $Ni(CO)_4$), cyclopentadienyls, alkyls ($Al_2(CH_3)_6$ or $Pb(CH_3)_4$), and some metal fluorides ($UF_6$) are also compatible with this process. Metalloid hydrides (e.g., $B_2H_6$) and alkyls (e.g., $Si(CH_3)_4$, $CH_3AsH_2$) are compatible with this process. And, some nonmetal alkyls, hydrides, fluorides and oxides are compatible with the process. Finally, an important electrically insulating material (MgO) can be deposited cleanly by decomposition of a tetramer of methylmagnesium t-butoxide from the vapor or liquid phase.

Once formed, the deposit layer(s) may be annealed by continued application of directed energy or general heating.

Figure 3:
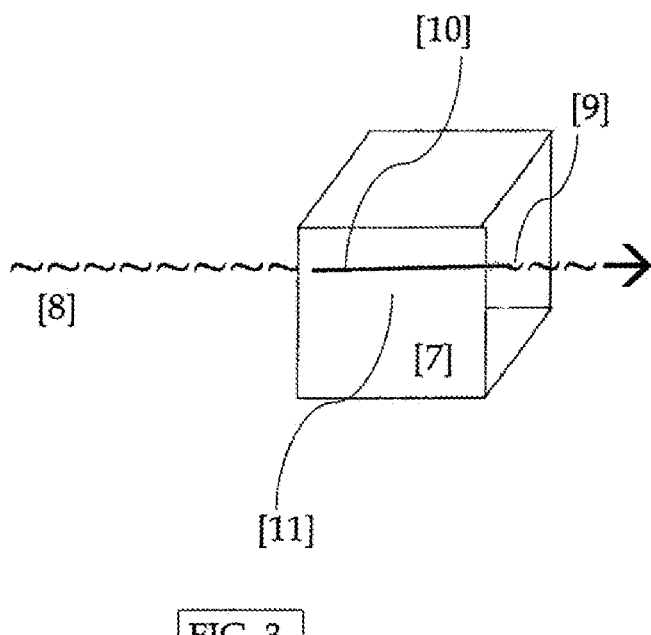

In accordance to a second embodiment (condensed phase) of the present invention (FIG. 3), the deposit precursor is dissolved in a liquid or solid (frozen) reaction mixture [7]. The directed electromagnetic energy [8] is emitted into the liquid or solid reaction mixture. In this case, short wavelength (usually much less than 300 nm) radiation is typically applied to induce photochemical reactions of the deposit precursors with minimum scattering of the energy source. The short wavelength radiation is typically either collimated of coherent (laser) to avoid quantum absorptions or activation energy even at low energy density. The deposit precursor is decomposed along a line of travel [9] of the directed electromagnetic energy through the reaction mixture to form the deposit filament suspended in the reaction mixture.

Figure 2:
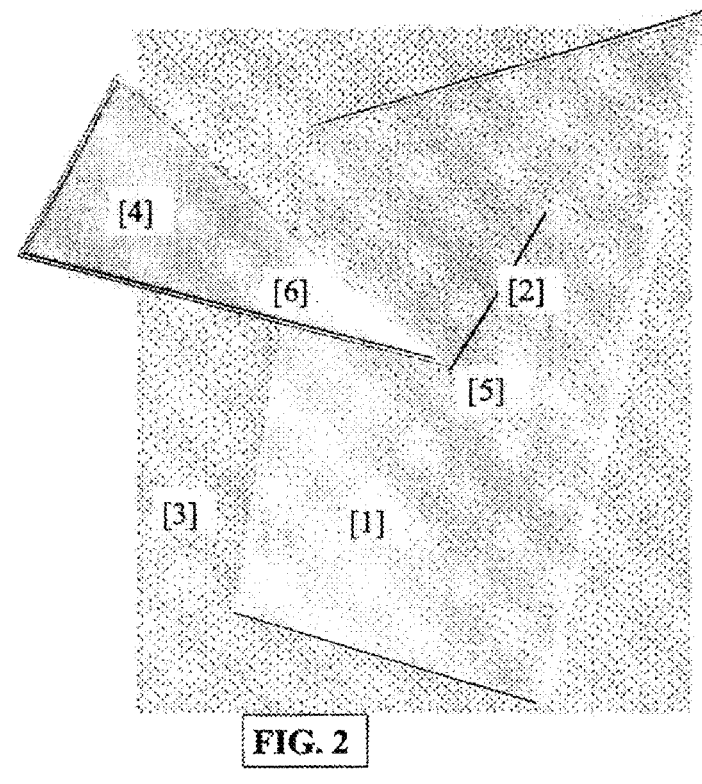
FIG. 2. Directed Energy used to heat a Substrate in the presence of the Gas-Phase Deposit Precursor FIG. 3. Electromagnetic Radiation directed through Liquid or Solid Reaction Mixture FIG. 4. Electric Current passed through a Reaction Mixture to produce a Filament FIG. 5. Electric Current passed through a Reaction Mixture to produce a deposit on a Substrate FIG. 6. High Energy Particle Beam depositing energy at the Bragg Peak in a Liquid or Solid Reaction Mixture FIG. 7. Electromagnetic Energy directed as an Interference Pattern (Hologram) into a Reaction Mixture and projected onto a Substrate

Excess reaction mixture is then removed from the reaction vessel to expose the deposit filament [10]. After the excess reaction mixture is removed, the deposit filament may then be annealed to dry and strengthen it if desired. And, the filament may be used as a substrate [1] for subsequent reaction such as doping or application of an insulating deposit (of MgO) as described in the first embodiment (FIG. 2).

A well-defined pattern for the deposit layer utilizing the second embodiment (FIG. 2) is possible through the incorporation of a quantity of scavenging compounds in the reaction mixture. In a condensed phase (liquid or solid), polymerization will tend to radiate outward from the point of initiation. The lateral or radial polymerization of the deposit precursor is suppressed within a zone in which the reactive intermediates that diffuse outside the beam of directed energy [9] are insufficient to overcome the effects of the scavenging agents. The concentration of scavenging agents limits the lateral or radial polymerization by terminally bonding to the reactive intermediates. The scavenging compounds is selected from a group comprising free-radical scavengers, ion scavengers, or combinations thereof. The free-radical scavenging agent may be of any type that reacts with free radicals. The ion scavenger may include a weak base, such as trimethylamine or pyridine, to neutralize the acid produced from the decomposition reaction.

Metallic, metalloid or nonmetal compounds, and combinations thereof can be added to liquid reaction mixture or the deposit filament in order to modify the properties of the deposit filament as described in the first embodiment, but these reagents are not necessarily volatile.

In another incarnation, the reaction mixture may be absorbed or adsorbed to a substrate. In these cases, almost any sort of directed energy may be used.

Figure 4:
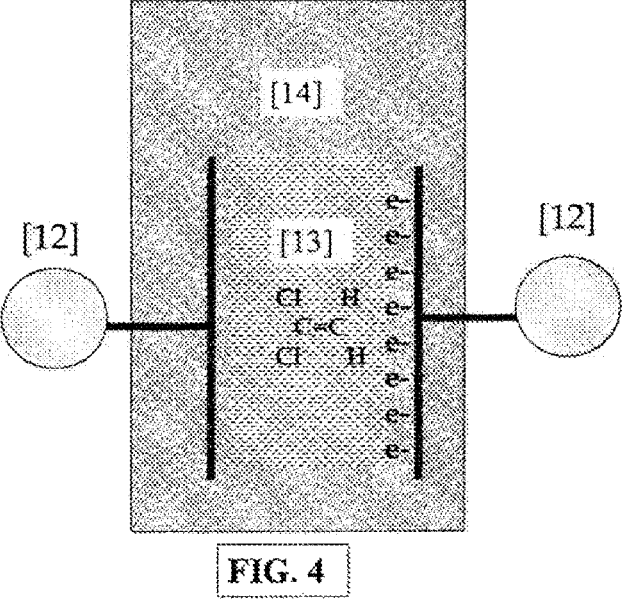
Figure 5:
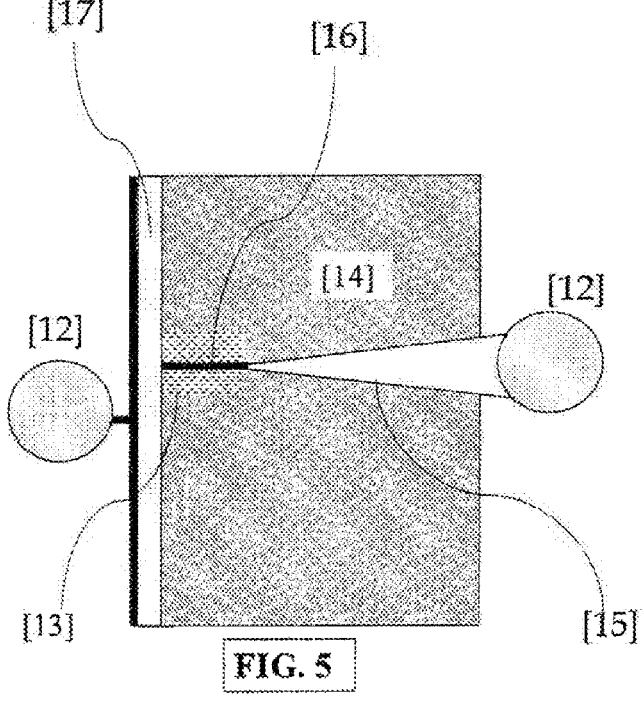

For some incarnations of the second embodiment (FIG. 4), the directed energy emission apparatus is a set of electrodes [12]. The set of electrodes allow for an electric current to pass through the reaction mixture and activate the deposit precursor. The set of electrodes is embedded into the reaction mixture, wherein the set of electrodes is offset from each other in order to allow the directed energy emission, electrical current, to pass through the reaction mixture. The electrical current is passed from one electrode to another. The deposit precursor is polymerized and decomposed as a filament or deposit (FIG. 5) along the path of the electrical current to produce the deposit filament or layer. The electrodes may be designed to only deposit elements on a small part of a substrate and moved across the surface or perpendicular to the surface to trace out the desired pattern of the deposit.

Figure 6:
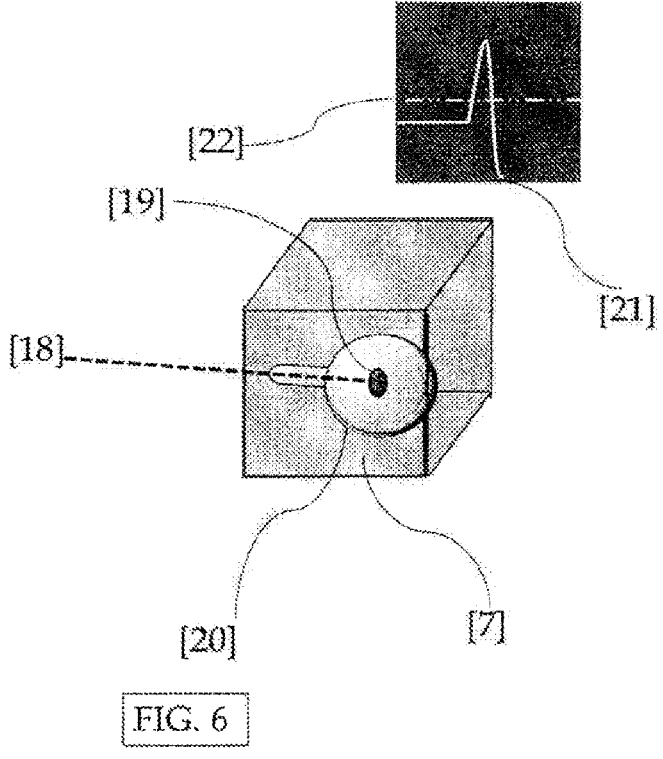

In accordance to another incarnation (FIG. 6) of the second embodiment, the directed energy emission is high kinetic energy particle radiation [18]. The deposit precursor decomposes at a Bragg peak of the directed energy emission to allow the deposit to be produced within the reaction mixture [7] (unattached to the reaction vessel or any substrate) in three-dimensions with the use of scavenging reagents to prevent uncontrolled spread of the deposit. The Bragg peak represents the distance through the reaction mixture that the high kinetic energy particle travels before the particles slow down and have very high linear energy transfer to the reaction mixture. (This technique is used in treatment of cancer tumors where surgery is not practical.) In FIG. 6, the linear energy transfer from the high energy particles to the reaction mixture is shown graphically and the upper limit of linear energy transfer that can be effectively suppressed to prevent polymerization and decomposition is shown on the same graph [22]. It is worth noting that this technique would accomplish the same thing as continuous three-dimensional printing and not require the patented "continuous liquid interface printing" (CLIP) technology (U.S. Ser. No. 15/068,133, U.S. Ser. No. 15/068,133), which uses "light" (e.g., electromagnetic, UV) radiation.

Figure 7:
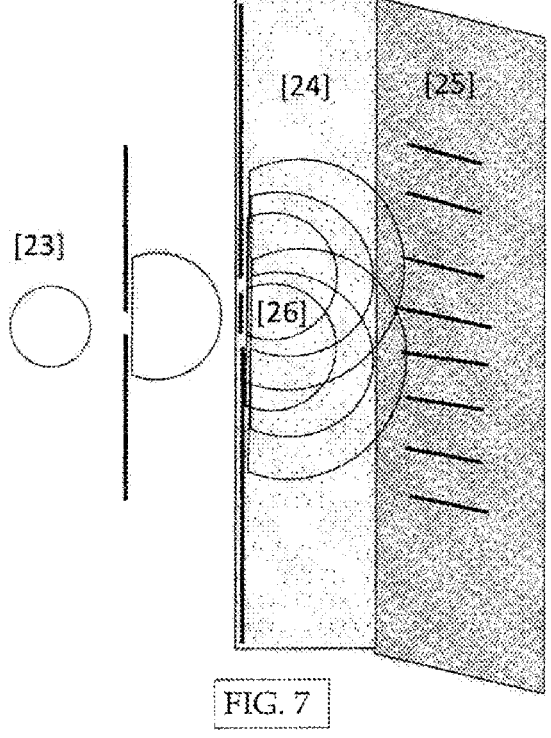

In some embodiments of the present invention (FIG. 7), electromagnetic directed energy emission is used to produce interference patterns within the reaction mixture or on the surface of a substrate [25]. The earliest method known to produce such interference patterns was the "double slit" method [26], which was originally used to prove the wave nature of light. Today, sophisticated optical systems are capable of producing three-dimensional holograms. This technology (simple interference or holography) can be used as a source of directed energy to cause polymerization and decomposition of monomers and oligomers with the potential for making three-dimensional objects directly.

For some other embodiments of the present invention, a computer numeric controller (CNC) is implemented to manipulate the directed energy emission in order to produce a pattern for the deposit layer or filament. The point of incidence of the directed energy emission is translated with the CNC to generate a path of incidence for the directed energy emission within the reaction vessel. The deposit precursor is decomposed along the path of incidence or on the surface of a substrate. The path of incidence is able to be generated in two or three dimensions to produce the pattern for the deposit layer.

In still another embodiment of the present invention, an insulating deposit precursor is utilized to impart an insulating layer onto the deposit layer to prevent electrical current flow through the insulating layer when the deposit layer is implemented. The reaction vessel is filled with the insulating precursor subsequent to the production of the deposit layer. The insulating precursor is decomposed within the reaction vessel at the point of incidence of the directed energy emission to produce an insulating layer adjacent to the deposit layer.

EXAMPLES

Part I. Deposition from the Gas Phase

A reaction vessel is filled with gaseous deposit precursor at a pressure less than 1 atmosphere (atm). The gaseous deposit precursor may be a single compound or mixture of compounds with at least one compound that is subject to reaction when heated or activated by electromagnetic radiation or energetic particles from the directed energy emission apparatus. Within the reaction vessel, a solid substrate is in contact with the gaseous deposit precursor. The solid substrate is heated at selective points with the directed energy emission, causing the reactive gas to decompose or polymerize on or near the surface of the solid substrate.

To produce fine lines of the deposit layer, a laser or focused beam of light or particles is directed to the surface by a suitable controller, such as a CNC. A substrate mask might be used especially if the substrate mask is reflective or has a higher heat capacity than the surface and hence does not become as hot as the surface of the substrate when struck by the directed energy emission; however, the substrate mask is not the primary method of controlling the location of deposition.

Specific gaseous deposit precursors suitable for this process includes isomers of tri-X-ethane, di-X-ethene (i.e., di-X-ethylene), and X-acetylene, where "X" signifies an electronegative substituent such as chlorine or other halogens. Volatile metal or metalloid compounds, such as carbonyls, alkyls, hydrides, cyclopentadienyls, may be used in combination with, or instead of, the carbon compounds.

Example 1

A thin piece of non-conducting material for the solid substrate is mounted within the reaction vessel. The reaction vessel is filled with a gaseous deposit precursor composed of 1,1-dichloroethene ($Cl_2C{=}CH_2$). The directed energy emission is a high energy laser. The directed energy emission is directed onto an external surface of the solid substrate. The solid substrate has a point of incidence on the inside of the container from heat transfer through the solid substrate. The molecules of the gaseous deposit precursor collide with the point of incidence and spontaneously undergo several reactions, including polymerization and elimination of hydrochloric acid (HCl), which is constantly removed from the reaction vessel through a scrubber. A deposit layer is produced on the solid substrate that is pure carbon or a mixture of carbon and polymer containing chlorine, Cl, and hydrogen, H. Continued application of directed energy completes decomposition to an allotrope of pure carbon.

If necessary, subsequent general heating and annealing of the solid substrate (in the absence of monomeric 1,1-dichloroethene) completes decomposition of the polymeric residue leaving virtually pure carbon. The carbon may be in a highly conductive from of carbon nanotubes or graphite or it may be in relatively non-conduction form (soot). If the latter is discovered, it can be annealed to a graphitic form if the support is a high melting material (like MgO or $Al_2O_3$).

Overall, this might be a pathway to produce conventional capacitors with high capacitance from numerous layers of conductive carbon (and/or metals deposited from volatile metal compounds, e.g., metal carbonyls) and insulators (e.g., MgO).

Example 2

The same as Example 1; however, a plurality of diffuse energy emissions, having a long wavelength, approximately 400-1,000 nm, and low photon energy, is passed through the gaseous deposit precursor and converged on the inside of the reaction vessel at a point of incidence on the solid substrate. If desired, the gaseous deposit precursor can be cooled below ambient temperature to prevent random decomposition of the gaseous deposit precursor in the gas phase.

Example 3

The same as Example 2 except the plurality of diffuse energy emissions is used to illuminate a substrate mask, which is either highly reflective or has a high heat capacity. The substrate mask provides a pattern as in photolithography for the production of the deposit layer. A metal guide may be heated by electric induction to facilitate deposition of the gaseous deposit precursor in a desired pattern.

Example 4

A semi-conductor type deposit layer may be produced as part of the process described in Examples 1 and 2 by including gaseous deposit precursors that contain electron-deficient molecules, such as diborane ($B_2H_6$), compounds with lone-pairs of electrons, such as arsine ($AsH_3$), and silane ($SiH_4$) with or without the carbon-generating compound (like 1,1-dichloroethene). In addition, compounds of elements from group III (boron-like) and group V (arsenic-like) on the periodic table involving bonds to organic groups (e.g., methyl-, ethyl-, allyl-) and halogens as well as hydrogen (for example, dimethylarsine ($(CH_3)_2AsH$ or trimethylarsine ($(CH_3)_3As$) might be used instead of hydrides of the elements.

Example 5

Pure metallic and alloy conductors may be produced by the directed energy emission methods described in Examples 1, 2 and 3 using carbonyl or cyclopentadienyl complexes such as iron pentacarbonyl ($Fe(CO)_5$) or nickel tetracarbonyl ($Ni(CO)_4$) as the gaseous deposit precursor. These gaseous deposit precursors are selective decomposed by guided beams of energy or induction heating as the directed energy.

Part II. Deposition from the Liquid or Solid Phase

The deposit precursor 1,1-dichloroethylene, is known to undergo polymerization when exposed to radiation. The deposit precursor is frozen to a temperature on the order of liquid nitrogen, approximately −210° C. The solid deposit precursor might include a weak base such as trimethylamine or pyridine to neutralize the acid produced and/or an electron and radicle scavenging compound, such as a disulfide compound, benzophenone etc., to terminate electrons and radicles diverging from the directed energy emission, and thus, suppress random radial polymerization of the solid deposit precursor. The solid deposit precursor is then subjected to the directed energy emission, a narrow beam of electromagnetic radiation or energetic particles. This induces polymerization and excess energy causes elimination of HCl leaving strands of polyethene ($=C=C=C=\ldots$) or polyethyne ($—CC—CC—CC—\ldots$) as the deposit layer. Being unstable relative to graphite and carbon nanotubes, the deposit layer is expected to react with adjacent polymers (at ambient temperature) to yield an electrically-conducting (sp$^2$-hybridized) continuous carbon fiber.

An electrical potential produced between two or more electrodes imbedded in the solid deposit precursor can also induce polymerization of the solid deposit precursor in a useful pattern. An electric arc may or may not be required for polymerization and or decomposition steps. The electrodes might initially be in close proximity and then be moved progressively apart as the polymer and/or carbon fiber forms between them in order to allow a charge to pass from one electrode to the other.

The three-dimensional network of the deposit layer produced in the solid deposit precursor is isolated by carefully evaporating the solid deposit precursor and then insulated by coating with MgO precipitated from the gas phase by decomposition of the tetramer of methylmagnesium t-butoxide.

Example 6

A solution of the deposit precursor, 1,1-dichloroethene, organic bases, and organic radical scavenger, with the molar ratio of approximately 100:10:1, is frozen into a solid at very low temperature (e.g., $-200°$ C.). The directed energy emission, a collimated beam of high energy radiation (e.g., x-rays or beta-rays), is directed as desired through the solid to initiate polymerization and decomposition of the deposit precursor along a path of incidence. High-energy, short-wavelength radiation is required to prevent scattering of the energy throughout the medium. The Bragg peak for the directed energy emission allows the reaction to be initiated in a preselected area along the directed energy emission.

Once the reaction is complete the excess solution is removed by sublimation or volatilization as the solid melts to ambient temperature. If necessary, general heating can be used to complete the decomposition reaction.

Once the reaction is complete, the deposit layer, a carbon fiber matrix, can be insulated and strengthened by a gaseous process such as coating with MgO deposition and strengthened by mass polymerization of a liquid (e.g., Lucite) to embed the carbon fibers.

Example 7

A solution as described in Example 10, is frozen around a pair of metal electrodes, that are initially close to each other. An electric potential is applied large enough to induce an electrical current to flow between the pair of electrodes. The resistance between the pair of electrodes decreases as the initial polymerization of 1,1-dichloroethene begins and then as the decomposition of the poly($—Cl_2C—CH_2—$) chains. The electrodes are then separated slowly by linear or helical motion producing a deposit layer of carbon fiber between the pair of electrodes. The diameter of the deposit layer is controlled by the current, diameter of the electrodes, and rate of separation. The deposit layer is then processed as described in Example 10.

Part III. Miscellaneous Applications

Example 8

An irregular part is heated above the decomposition temperature of the deposit precursor, 1,1-dichloroethylene, and immersed partially or totally into the deposit precursor, including scavenging compounds. In this example, the deposit layer is formed on the surface of the irregular part. If the irregular part is made partially of metal, a cooler section of the irregular part can be suspended by a non-metallic string in deposit precursor and heated using induction heating as the directed energy. For example, a metallic wire could be heated using induction heating or conduction, such as electrical resistance, and deposit precursor. Coating of broad surfaces to make sheets of metal, glass, ceramic, plastics, paper, woven fabrics, etc. with carbon and/or metallic coatings is possible through this method. The coating can be built up continuously or in layers, which might be a deposit layer of carbon, metals, alloys, glass, plastics, ceramics, etc.

Example 9

A solid substrate that is nanoparticles of metal is coated in the gas phase or liquid phase by suspending them in a static or flowing stream of fluid composed of the deposit precursor, such as 1,1-dichloroethylene, an associated isomer or analogue ($C_2H_2X_2$), and heating the deposit precursor with the directed energy emission causing the polymerization or decomposition of the deposit layer of carbon compound on the surface. Some of the carbon is absorbed if the metal is heated to a threshold temperature, and carbon nanotubes can grow from inductively heated nanoparticles suspended in the gas phase using compounds of the general formula $C_2H_2X_2$ or hydrocarbons (e.g., methane, ethane or acetylene). Such a reaction involves distinct sequences of heating with the directed energy emission to take advantage of the polymerization on the surface followed by decomposition to carbon and absorption.

Example 10

The nanoparticles (including molecular and atomic scale) of metal (mentioned in Example 9) are prepared in situ by decomposition of volatile metal compounds by radiant energy (blackbody or selected wavelengths), induction heating, electrical discharge, etc. as the directed energy emission.

Although the invention has been explained in relation to its preferred embodiment, it is to be understood that many other possible modifications and variations can be made without departing from the spirit and scope of the invention as hereinafter claimed.

Example 11

A cathode ray tube programmed very much like a television set to project a series of images is used to direct beams of energetic electrons into a reaction mixture formed by rarified vapor of a volatile deposit precursor sweeping through the reaction vessel. Some of the deposit precursor is condensed onto a cool surface of a substrate where it is converted into a deposit of an element or polymer to form a continuous growing three-dimensional deposit. Any inadvertent particles of deposit produced by reaction in the gas phase are swept away and filtered as the gas phase is recycled and recharged while the byproducts are scavenged.

Example 12

An array of small independent electrodes are activated in various patterns programmed much like an imaged projected by a television. The electrodes locally activate reaction in a reaction mixture such that a deposit adheres to the counter electrode. The counter electrode is progressively pulled away from the array of electrodes while the reaction mixture containing the deposit precursor oozes out from among the programmed electrodes from a suitable reservoir.

What is claimed is:

1. A method for creating patterns on surfaces by directed energy deposition of metals or metal-containing compounds said method comprising, selecting a pattern for deposition on a surface of a solid substrate, providing a reaction mixture comprised of a deposit precursor, a directed electromagnetic radiation apparatus, said solid substrate, and a reaction vessel, placing the substrate and reaction mixture in the form of a gas or liquid, which is absorbed or adsorbed to the substrate, into the reaction vessel, selectively sending directed electromagnetic radiation towards the adsorbed or absorbed reaction mixture in the reaction vessel with the directed energy emission apparatus, wherein said selectively sending directed electromagnetic radiation step further comprising either:

inscribing said pattern with a moving point of incidence of said directed electromagnetic radiation, or applying said preselected pattern to said substrate, wherein the form of said preselected pattern is embodied in an interference pattern of the electromagnetic waves applied to said substrate, wherein the deposit precursor is a volatile or soluble substance selected from a group consisting of metal carbonyls, metal, metalloid alkyls, metal hydrides, metalloid hydrides, metal cyclopentadienyls, metal alkoxides, metal acetates and combinations thereof, wherein an electrically insulating layer is deposited by directed energy acting on a magnesium containing precursor compound such that magnesium oxide is deposited upon decomposition, thereby forming said insulating layer.

2. The method for creating patterns on surfaces by directed energy deposition of metals or metal-containing compounds according to claim 1 wherein said pattern is created de novo on said surface.

3. A method for creating patterns on surfaces by directed energy deposition of metals or metal-containing compounds said method comprising, selecting a pattern for deposition on a surface of a solid substrate, providing a reaction mixture comprised of a deposit precursor, a directed electromagnetic radiation apparatus, said solid substrate, and a reaction vessel, placing the substrate and reaction mixture in the form of a gas or liquid, which is absorbed or adsorbed to the substrate, into the reaction vessel, selectively sending directed electromagnetic radiation towards the adsorbed or absorbed reaction mixture in the reaction vessel with the directed energy emission apparatus, wherein said selectively sending directed electromagnetic radiation step further comprising either:

inscribing said pattern with a moving point of incidence of said directed electromagnetic radiation, or

applying said preselected pattern to said substrate, wherein the form of said preselected pattern is embodied in an interference pattern of the electromagnetic waves applied to said substrate, wherein the deposit precursor is a volatile or soluble substance selected from a group consisting of metal carbonyls, metal, metalloid alkyls, metal hydrides, metalloid hydrides, metal cyclopentadienyls, metal alkoxides, metal acetates and combinations thereof, wherein electromagnetic energy including laser light is directed by an optical device which creates an intense beam or interference pattern in three dimensions or is projected onto a two-dimensional surface in said selected pattern such that the deposit precursors are only activated to become a deposit where overlapping electromagnetic waves reinforce, and further wherein an electrically insulating layer is deposited by directed energy acting on a precursor compound wherein magnesium oxide is deposited upon decomposition of said precursor compound, thereby forming an insulating layer.

4. The method for creating patterns on surfaces by directed energy deposition of metals or metal-containing compounds according to claim 3 wherein said pattern is created de novo on said surface.

5. A method for de novo creation of patterns on surfaces by directed energy deposition of metals or metal-containing compounds said method comprising, selecting a pattern for de novo deposition on a surface of a solid substrate, generating said pattern de novo by, providing a reaction mixture comprised of a deposit precursor, a directed electromagnetic radiation apparatus, said solid substrate, and a reaction vessel, placing the solid substrate and reaction mixture in the form of a gas or liquid, into the reaction vessel, selectively sending directed electromagnetic radiation such that the directed energy is directed onto a surface of the solid substrate, wherein, said directed electromagnetic radiation having a wavelength greater than 700 nanometers, wherein the directed energy impinging onto the substrate, thereby directly heating the substrate to effect thermal decomposition of said deposit precursor at the surface of the solid substrate, wherein said selectively sending directed electromagnetic radiation step further comprising either:

inscribing said pattern with a moving point of incidence of said directed electromagnetic radiation on said surface of the solid substrate, or applying said preselected pattern to said surface of the solid substrate, wherein the form of said preselected pattern is embodied in an interference pattern of the electromagnetic waves applied to said surface of said substrate, wherein the deposit precursor is a volatile or soluble substance selected from a group consisting of metal carbonyls, metal, metalloid alkyls, metal hydrides, metalloid hydrides, metal cyclopentadienyls, metal alkoxides, metal acetates and combinations thereof.

6. The method for de novo creation of patterns on surfaces according to claim 5 wherein the deposit precursor is comprised of a metal carbonyl compound.

7. The method for de novo creation of patterns on surfaces by directed energy deposition of metals or metal containing compounds of claim 5 in which electromagnetic energy including laser light is projected onto a two-dimensional surface in said selected pattern such that the deposit precursors are only activated to become a deposit where overlapping electromagnetic waves reinforce.

*   *   *   *   *